(12) United States Patent
Kemerer et al.

(10) Patent No.: US 8,198,663 B2
(45) Date of Patent: Jun. 12, 2012

(54) STRUCTURE FOR DUAL CONTACT TRENCH CAPACITOR AND STRUCTURE THEREOF

(75) Inventors: Timothy W. Kemerer, Essex Junction, VT (US); Jenifer E. Lary, Hinesburg, VT (US); James S. Nakos, Essex Junction, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/181,343

(22) Filed: Jul. 29, 2008

(65) Prior Publication Data

US 2010/0025814 A1    Feb. 4, 2010

(51) Int. Cl.
*H01L 27/108*    (2006.01)

(52) U.S. Cl. ......... 257/301; 257/303; 257/304; 257/532

(58) Field of Classification Search .................. 257/301, 257/303, 304, 532
See application file for complete search history.

(56) References Cited

U.S. PATENT DOCUMENTS

| | | |
|---|---|---|
| 4,645,564 A | 2/1987 | Morie et al. |
| 4,918,502 A | 4/1990 | Kaga et al. |
| 5,275,974 A | 1/1994 | Ellul et al. |
| 6,236,079 B1 | 5/2001 | Nitayama et al. |
| 6,259,149 B1 * | 7/2001 | Burkhardt et al. ............ 257/534 |
| 6,344,413 B1 | 2/2002 | Zurcher et al. |
| 6,455,369 B1 | 9/2002 | Forster et al. |
| 6,750,096 B2 | 6/2004 | Steck et al. |
| 6,954,921 B2 | 10/2005 | Hassibi et al. |
| 6,972,451 B2 * | 12/2005 | Delpech et al. ................ 257/304 |
| 7,170,125 B2 | 1/2007 | Seidl et al. |
| 7,344,953 B2 | 3/2008 | Hecht et al. |
| 7,554,148 B2 | 6/2009 | Su et al. |
| 2004/0232557 A1 * | 11/2004 | Kim .............................. 257/758 |
| 2005/0110114 A1 | 5/2005 | Lu et al. |
| 2006/0134877 A1 | 6/2006 | Goebel et al. |
| 2006/0194348 A1 * | 8/2006 | Araujo et al. ..................... 438/3 |
| 2007/0058458 A1 * | 3/2007 | Pan ......................... 365/189.09 |
| 2007/0059879 A1 * | 3/2007 | Ting .............................. 438/239 |
| 2007/0148899 A1 * | 6/2007 | Kim .............................. 438/396 |
| 2008/0048232 A1 | 2/2008 | Su et al. |
| 2008/0291601 A1 | 11/2008 | Roozeboom et al. |
| 2009/0072313 A1 | 3/2009 | Cai et al. |
| 2009/0134925 A1 | 5/2009 | Cannon et al. |

OTHER PUBLICATIONS

Office Action for corresponding U.S. Appl. No. 12/181,338.
Notice of Allowance dated Oct. 25, 2010, in U.S. Appl. No. 12/181,335.
Final Office Action dated Jun. 18, 2010, in U.S. Appl. No. 12/181,335.
Non-Final Office Action dated Feb. 18, 2010, in U.S. Appl. No. 12/181,335.
Non-Final Office Action dated Oct. 19, 2010, in U.S. Appl. No. 12/181,341.
Final Office Action for related U.S. Appl. No. 12/181,341, dated Mar. 29, 2011.

(Continued)

*Primary Examiner* — Tan N Tran
(74) *Attorney, Agent, or Firm* — Anthony Canale; Roberts Mlotkowski Safran & Cole, P.C.

(57) ABSTRACT

A dual contact trench capacitor and design structure for a dual contact trench capacitor is provided. The structure includes a first plate extending from a trench and isolated from a wafer body, and a second plate extending from the trench and isolated from the wafer body and the first plate.

25 Claims, 8 Drawing Sheets

OTHER PUBLICATIONS

C.C.-H Hsu et al., "A high Speed, Low Power P-Channel Flash EEPROM Using Silicon Rich Oxide as Tunneling Dielectric", 1992, pp. 140-142.

D.J. DiMaria et al., "Hight current injection into SiO2 from Si rich SiO2 films and experimental applications", Jan. 23, 1980, pp. 2722-2735.

* cited by examiner

Tab approach to making trench contacts

US 8,198,663 B2

STRUCTURE FOR DUAL CONTACT TRENCH CAPACITOR AND STRUCTURE THEREOF

CROSS-REFERENCE TO RELATED APPLICATIONS

This application is related to U.S. Ser. Nos. 12/181,338, 12/181,335 and 12/181,341 filed on the same day and currently pending.

FIELD OF THE INVENTION

The present invention generally relates to a design structure, and more particularly, to a dual contact trench capacitor and design structure for a dual contact trench capacitor.

BACKGROUND OF THE INVENTION

Capacitors are used to store charge in integrated circuits (ICs) such as in DRAM and SRAM cells. However, the growing demand for increasingly smaller and thus more cost effective semiconductor devices, e.g., with large memory capacities, has pushed the development of miniaturized structures in sub-micron technologies. But such miniaturization has its limits. For example, the size of the capacitor becomes increasingly larger with regard to the circuit itself, thus taking up considerable chip real estate. Also, in certain applications, the capacitor can become easily disrupted due to radiation or other unwanted external charging events.

By way of example, for certain radiation hardened applications the use of a dual capacitor dual, resistor feedback has been used. These structures, though, take up a considerable amount of real estate and have not been found to be very robust to radiation events, for example. Other applications include a single capacitor and two resistor configuration which is believed to be more robust to exposure to high radiation environments such as space applications. However, this approach places additional requirements on the properties of the capacitor. In particular, both electrodes cannot be contacting any part of the silicon, either diffusion or substrate. If they are a radiation event will upset the SRAM cell, regardless of where the electrons hit the cell. For example, in a radiation environment, electron hole pairs (e.g., carriers of electric charge) will be swept to a voltage potential which, in turn, will disrupt the state of the capacitor.

Also, it is known to use MIMs in radiation and other environments. However, as technology nodes have advanced the capacitance values attainable at practical sizes have not been able to scale with the circuit requirements.

Accordingly, there exists a need in the art to overcome the deficiencies and limitations described hereinabove.

SUMMARY

In a first aspect of the invention, a structure comprises a first plate extending from a trench and isolated from a wafer body, and a second plate extending from the trench and isolated from the wafer body and the first plate.

In an additional aspect of the invention, a method in a computer-aided design system for generating a functional design model of a dual contact trench capacitor comprises: forming a first plate extending from a trench and isolated from a wafer body; forming independently a second plate extending from the trench and isolated from the wafer body and the first plate; forming a dielectric layer isolating the first plate from the second plate; forming a dielectric layer isolating the first plate from the wafer body; and forming an isolation structure within the wafer body and on sides of the first plate and the second plate, wherein the first plate and the second plate are connected to contacts at least partially within a trench dielectric boundary.

In a further aspect of the invention, a design structure for a dual trench capacitor is embodied in a machine readable medium for designing, manufacturing, or testing an integrated circuit. The design structure comprises a first plate extending from a trench and isolated from a wafer body, and a second plate extending from the trench and isolated from the wafer.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a trench capacitor and a design structure for a dual contact trench capacitor. By implementing the invention, it is now possible to prevent radiation or other unwanted charging events from disrupting the capacitor. This is possible by providing isolated contacts or electrode plates in a dual contact trench capacitor arrangement. Also, the present invention provides more capacitance using conventional dielectrics than known MIM (Metal Insulator Metal) structures thus allowing a more extendable approach. Also, the contact trench capacitor arrangement of the present invention is scalable and easily tunable with future generation devices. The present invention is well adapted for space and military applications.

Structure and Fabrication Processes

Figure 1:
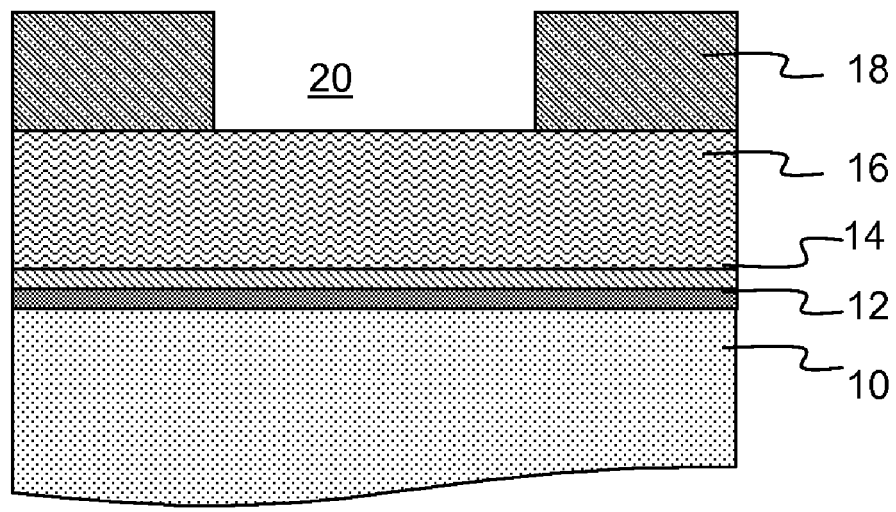
FIG. 1 represents a beginning structure and processes for fabricating the structure in accordance with the invention.

FIG. 1 represents a beginning structure and processes for fabricating the structure in accordance with the invention. More specifically, FIG. 1 shows a silicon dioxide ($SiO_2$) layer 12 formed on a conventional substrate 10 such as silicon (e.g., wafer body). In embodiments, the $SiO_2$ layer 12 is deposited on the substrate 10 in a conventional deposition process. The $SiO_2$ layer 12 can range in thickness depending on its application. More specifically, in one illustrative non-limiting example, the $SiO_2$ layer 12 can range in thickness from about 500 Å to 600 Å.

A Silicon Nitride (SiN) layer 14 is deposited on the $SiO_2$ layer 12 layer in a conventional deposition process. The SiN layer 14 is preferably $Si_3N_4$ with a thickness of about 1200 Å; although, other thicknesses are also contemplated by the invention. A dielectric layer 16 is deposited on the SiN layer 14 in a conventional deposition process known to those of skill in the art. In embodiments, the dielectric layer 16 is BPSG (borophospho-silicate glass) with one contemplated thickness of about 10,000 Å.

A resist 18 is selectively patterned on of the dielectric layer 16 to form an opening 20. The resist 18 can be patterned in any conventional manner such as, for example, exposing the resist 18 to a light source. For example, a mask material (not shown) may be deposited over the resist 18 at selective portions. For reasons of discussion, the mask is formed over a dual contact trench capacitor location. Once the mask is formed, using conventional photolithographic processes, a hole can be opened to expose portions of the dielectric layer 16. The exposed portions of the dielectric layer 16 are then etched using a conventional reactive ion etching process.

Figure 2:
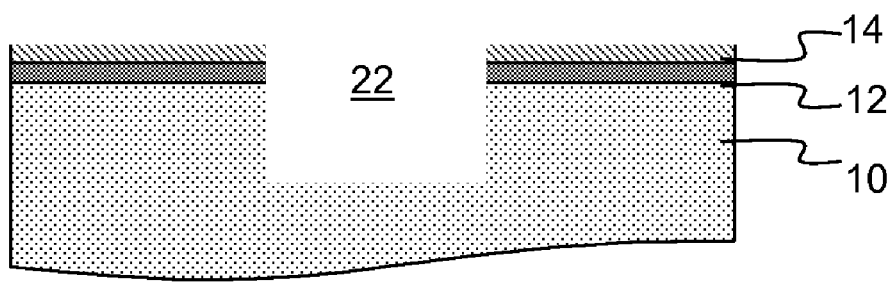
FIGS. 2-12 represent intermediate and final structures and respective processes for fabricating the structure in accordance with the invention.

Referring to FIG. 2, a trench 22 is formed in the substrate 10 using conventional etching processes. More specifically, using conventional etching processes such as, for example, Reactive Ion Etching (RIE), an opening is formed through the dielectric layer 16, SiN layer 14 and $SiO_2$ layer 12 and into the substrate 10. In this etching process, the RIE will also etch away the resist 18 and, using an HF solution, the dielectric layer 16. Although not shown, it should be understood that remnants of the dielectric layer 16 may still be present on the SiN layer 14 after the etching process. In embodiments, the HF solution can be a buffered or dilute HF solution, which is selective to SiN. Also, as should be understood by those of skill in the art, the dielectric layer 16 may act as a mask during the etching process.

In embodiments, the trench 22 can be of many different depths, depending on the capacitance targets. For example, the trench 22 can extend entirely through the substrate 10 in order to provide higher capacitance due to an increased surface area of subsequently formed plates. In other non-limiting embodiments, though, the trench 22 can range in depth from about 4 microns to about 10 microns.

Figure 3:
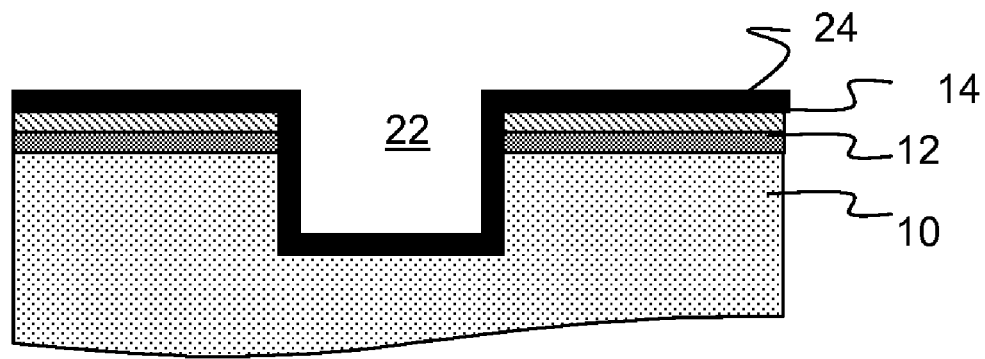

In FIG. 3, a dielectric material 24 is deposited on the structure of FIG. 2, including within the trench 22. The dielectric material 24 may be deposited using any conventional deposition process such as, for example, chemical deposition processes (CVD). In embodiments, CVD is known to increase the conformance of the dielectric material 24 over the structure. The dielectric material 24 may be, for example, Silicon Nitride, Silicon Oxide, Silicon Nitride Oxide or Oxide Nitride Oxide. In embodiments, the dielectric material 24 isolates the substrate 10 from subsequently formed electrode plates thereby eliminating capacitance coupling that may result from an unwanted charging event. To eliminate the capacitance coupling, the dielectric material 24 can be in the range of about 800 Å to about 900 Å.

It is also contemplated that a capacitor can be formed with the dielectric material 24, a conductive layer (see, FIG. 5.) and the substrate 10. For example, the dielectric material 24 can be thinly deposited, typically in the range of about 20 Å, such that a capacitor is formed with the dielectric material 24 (insulator), a subsequently laid conductive layer (e.g., a first plate of the capacitor) and the substrate 10 (e.g., a second plate of the capacitor). As should be known to those of skill in the art, the thickness of the dielectric material 24 may vary depending on the capacitance targets, with thinner layers increasing the capacitance of the capacitor.

Figure 4:
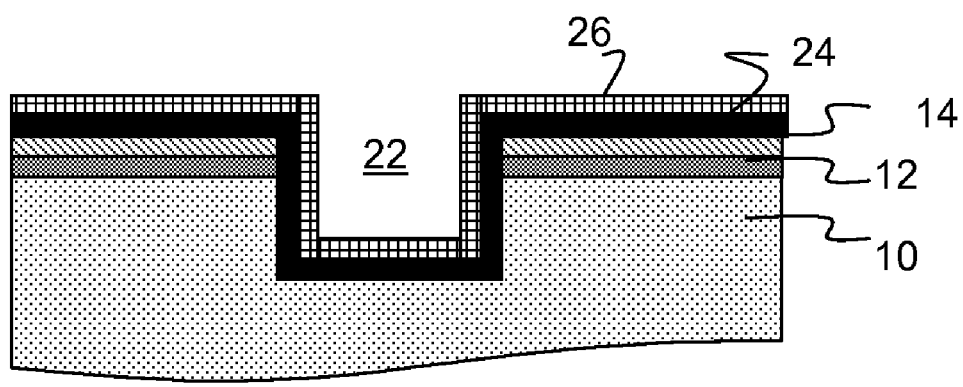

FIG. 4 shows a deposition of a poly layer 26 over the structure of FIG. 3. In embodiments, the deposition process is a conventional CVD process. In further embodiments, the poly layer 26 can range in thickness from about 500 Å to about 1500 Å. In still further embodiments, the poly layer 26 can be substituted with a metal layer or a metal silicide layer in order to obtain different temperature coefficients. The metal silicide layers contemplated by the invention include, for example, Tungsten Silicide, Titanium Silicide or Cobalt Silicide.

As should be understood by those of skill in the art, the layer 26 (whether a poly, metal or metal silicide), will form a lower plate of the electrode, which will be exposed on the upper surface of the structure to form a contact region. The lower plate will be an independent electrode, isolated from the wafer body (i.e., substrate). In this manner, electron hole pairs created by, for example, radiation or other unwanted charging events, will not be swept to the first electrode as it is isolated from the wafer body. As such, the electrons hitting the wafer body will not disrupt the capacitor.

Figure 5:
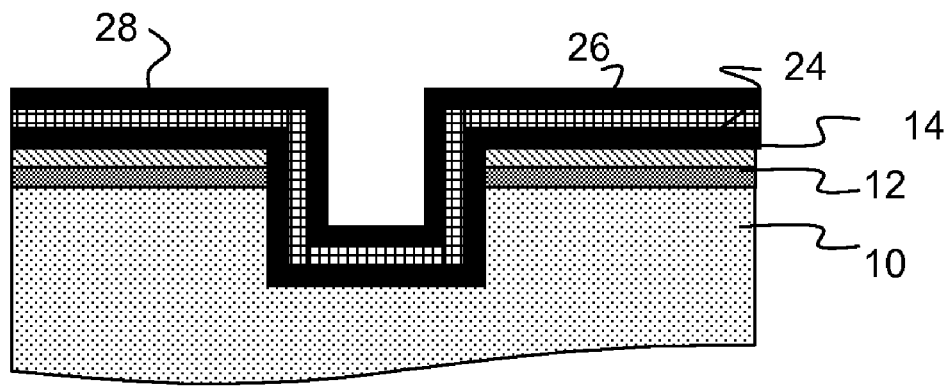

In FIG. 5, a dielectric material 28 is deposited on the structure of FIG. 4. The dielectric material 28 may be deposited in any conventional deposition process such as, for example, chemical deposition processes (CVD). The dielectric material 28 may be, for example, Silicon Nitride, Silicon Oxide, Silicon Nitride Oxide or Oxide Nitride Oxide. In embodiments, the dielectric material 28 can be in the range of about 20 Å to about 100 Å in thickness. As should be known to those of skill in the art, the thickness of the dielectric material 28 may vary depending on the capacitance targets, with thinner layers increasing the capacitance of the capacitor.

Figure 6:
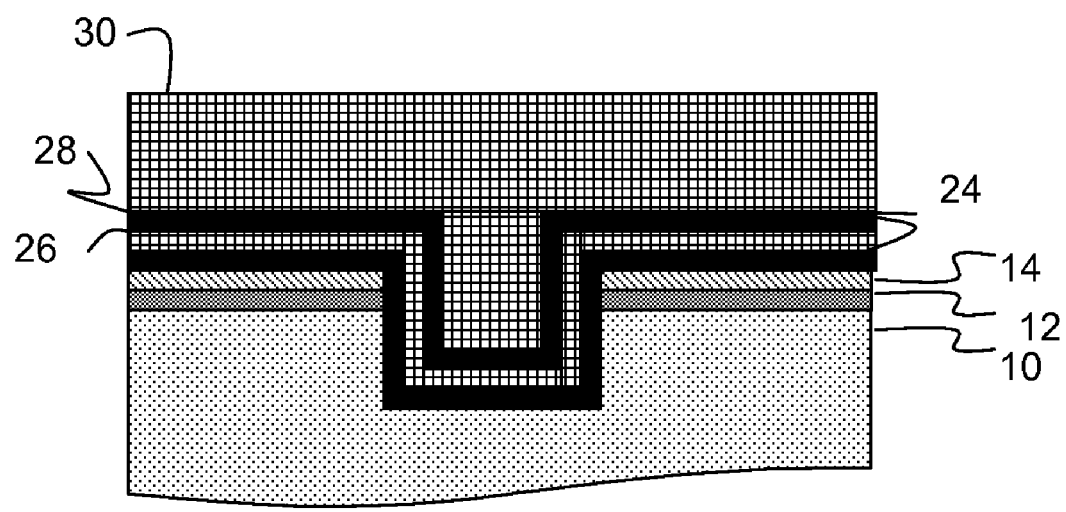

FIG. 6 shows a deposition of a poly layer 30 over the structure of FIG. 5 using a conventional CVD process. In embodiments, the poly layer 30 can completely fill the trench. In still further embodiments, the poly layer 30 can be substituted with a metal layer or a metal silicide layer in order to obtain different temperature coefficients. The metal silicide layers contemplated by the invention include, for example, Tungsten Silicide, Titanium Silicide or Cobalt Silicide. In embodiments, it is preferable to match the poly layer 26 with the poly layer 30.

The layer 30 (whether a poly, metal or metal silicide) will form an upper plate of the electrode, which will be exposed on the upper surface of the structure to form a contact region. The upper plate will be an independent electrode, isolated from the wafer body (i.e., substrate) and the lower plate. Much like the lower plate, in this manner, electron hole pairs created by, for example, radiation or other unwanted charging events, will not be swept to the first electrode as it is isolated from the wafer body. As such, the electrons hitting the wafer body will not disrupt the capacitor.

Figure 7:
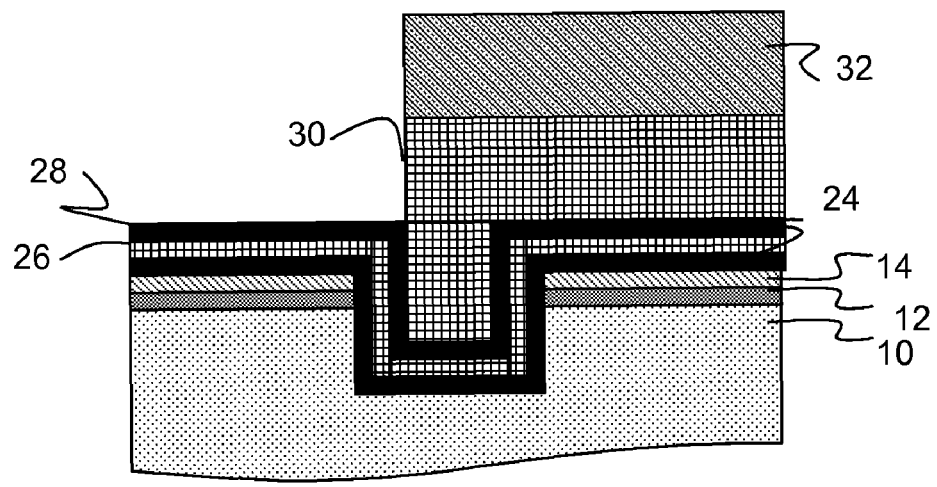

In FIG. 7, a resist 32 is placed over the structure of FIG. 6, and preferably over the filled trench. In a conventional manner, as discussed above, selective portions of the resist 32 are opened and an etching process is performed to etch a portion of the poly layer 30, on the side of the filled in trench.

Figure 8:
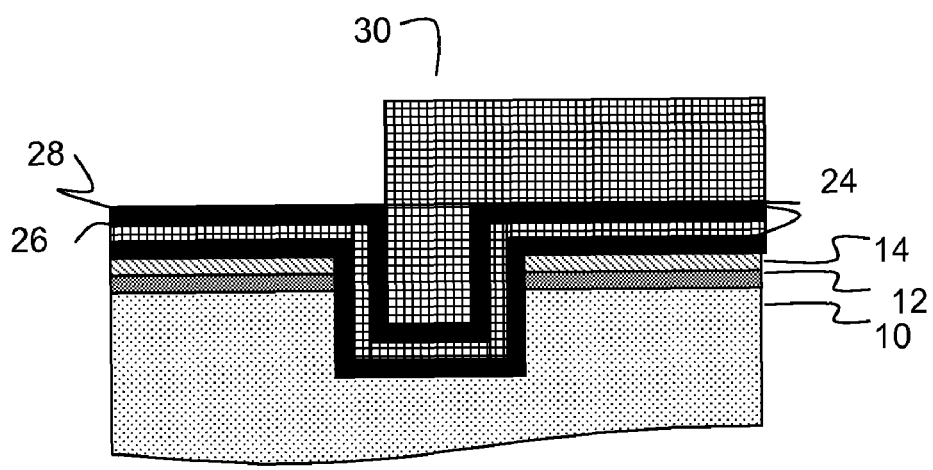

In FIG. 8, the resist layer 32 is removed. In embodiments, the dielectric material 28 can also be removed during the removal of the resist layer 32. This process will expose the poly layer 26, which will form the independent and isolated lower plate of the capacitor.

Figure 9:
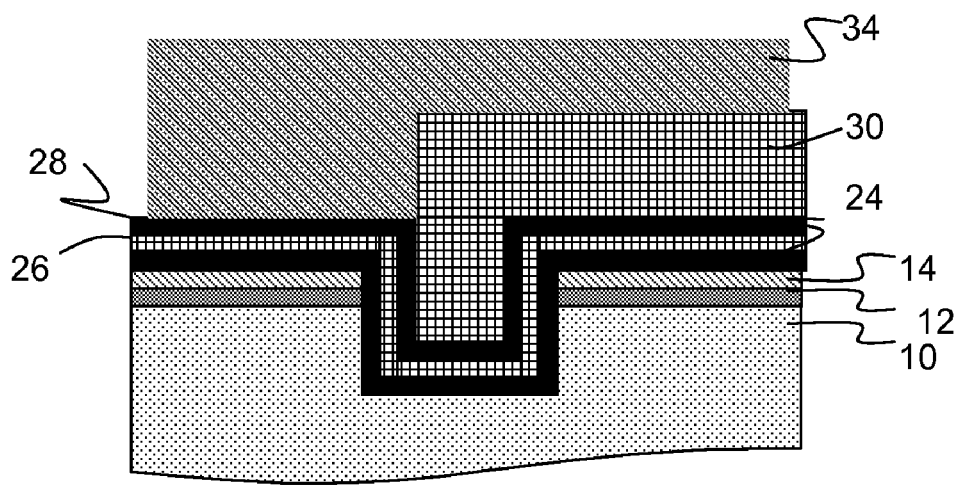
Figure 10:
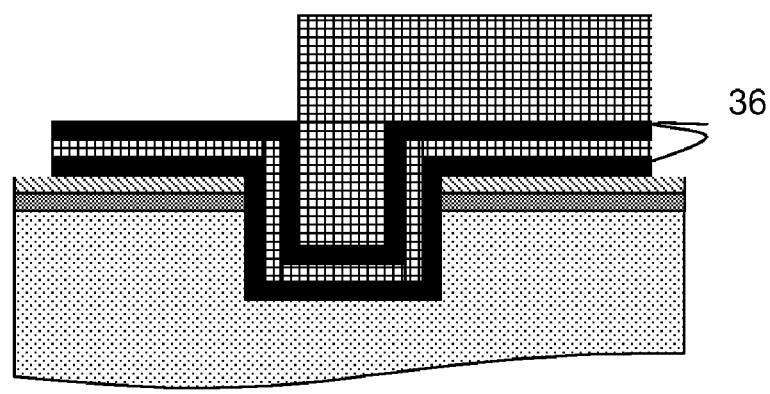

In FIG. 9, a resist 34 is applied to the structure of FIG. 8. In embodiments, the resist 34 is opened so that it does not extend across the entire structure of FIG. 8. As discussed above, the resist 34 can be patterned in any conventional manner such as, for example, exposing the resist to a light source. In embodiments, after an etching process, e.g., RIE, this arrangement will result in a shoulder 36 such as shown in FIG. 10. The deposition and etching of the resist can be in such a manner to also eliminate or substantially eliminate the shoulder.

Figure 11:
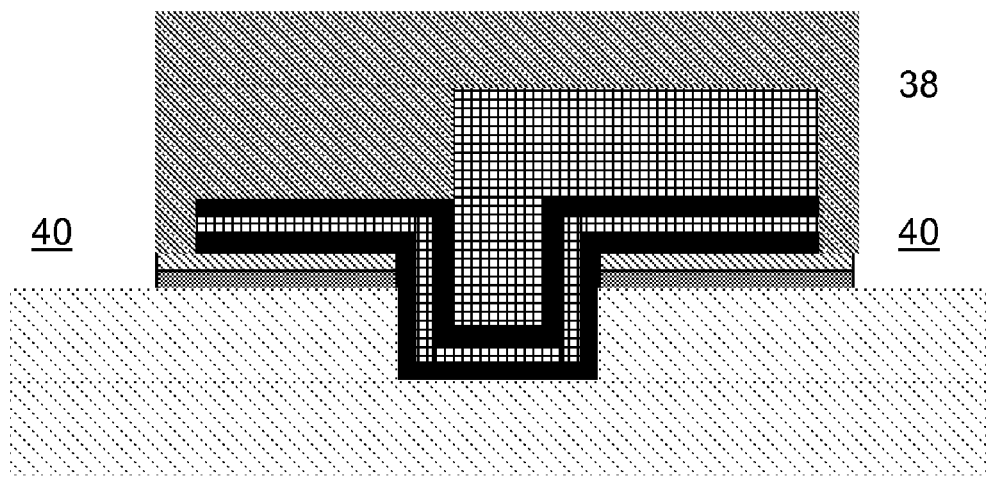

In FIG. 11, a resist 38 is formed over the structure of FIG. 10. The resist 38 is selectively patterned to form openings 40. As discussed above, the resist 38 can be patterned in any conventional manner such as, for example, exposing the resist to a light source.

Figure 12:
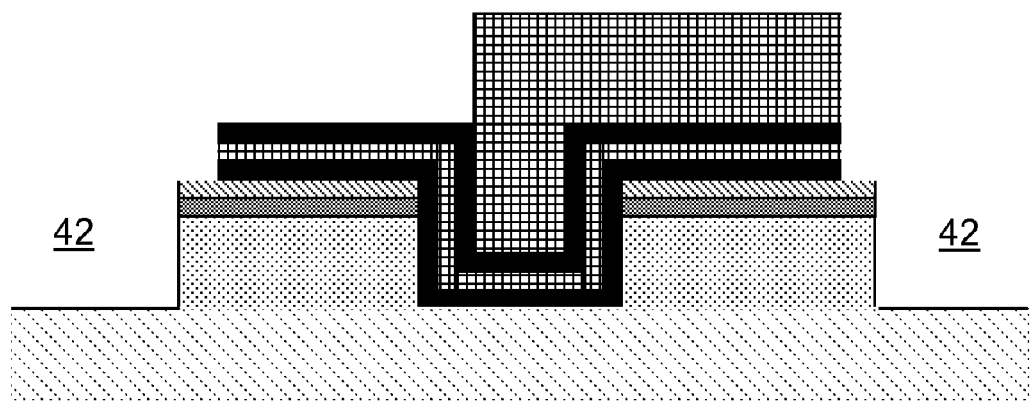

As shown in FIG. 12, the structure of FIG. 11 is etched using a conventional etching process such that portions of the Silicon Nitride (SiN) layer 14, SiO$_2$ layer 12 and substrate are etched to form trenches 42. The trenches 42 are subsequently filled with, e.g., an oxide material, to form conventional shallow trench isolation structures (STI).

Figure 13A:
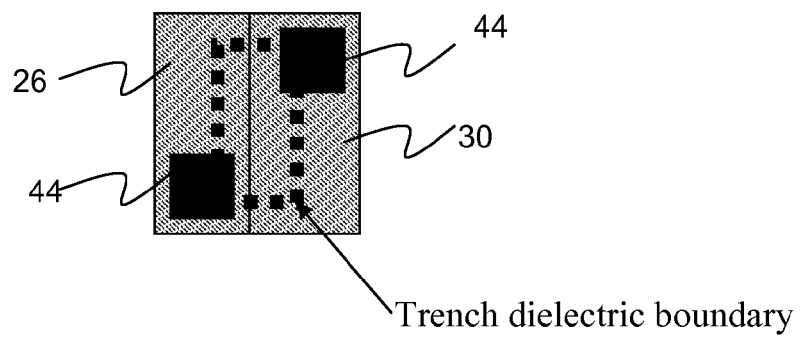
FIGS. 13a and 13b show a top view of final structures in accordance with the invention.
Figure 13B:
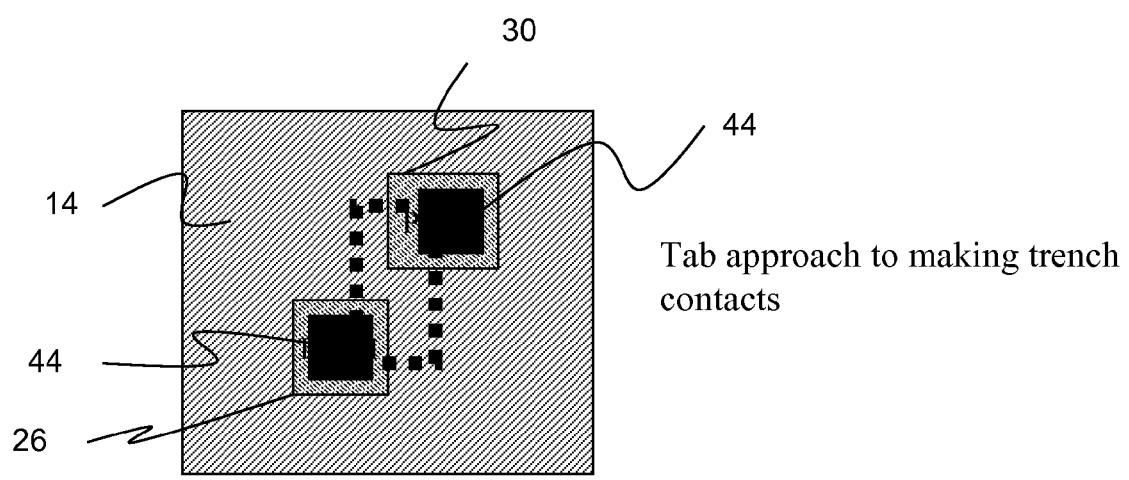

FIGS. 13a and 13b show top views of structures of the present invention after back of the line processes, e.g., formation of contacts 44. It should be understood by those of skill in the art that the formation of the contacts 44 includes an etching process, which can etch away portions of the dielectric material 28 to expose the underlying layer 26. In this way the contacts 44 can be formed to contact both the layer 26 and the layer 30, extending at least partially within the trench dielectric boundary. FIG. 13b shows a conventional tab approach of making the trench contacts with the novel structure of FIG. 12.

Design Structure

Figure 14:
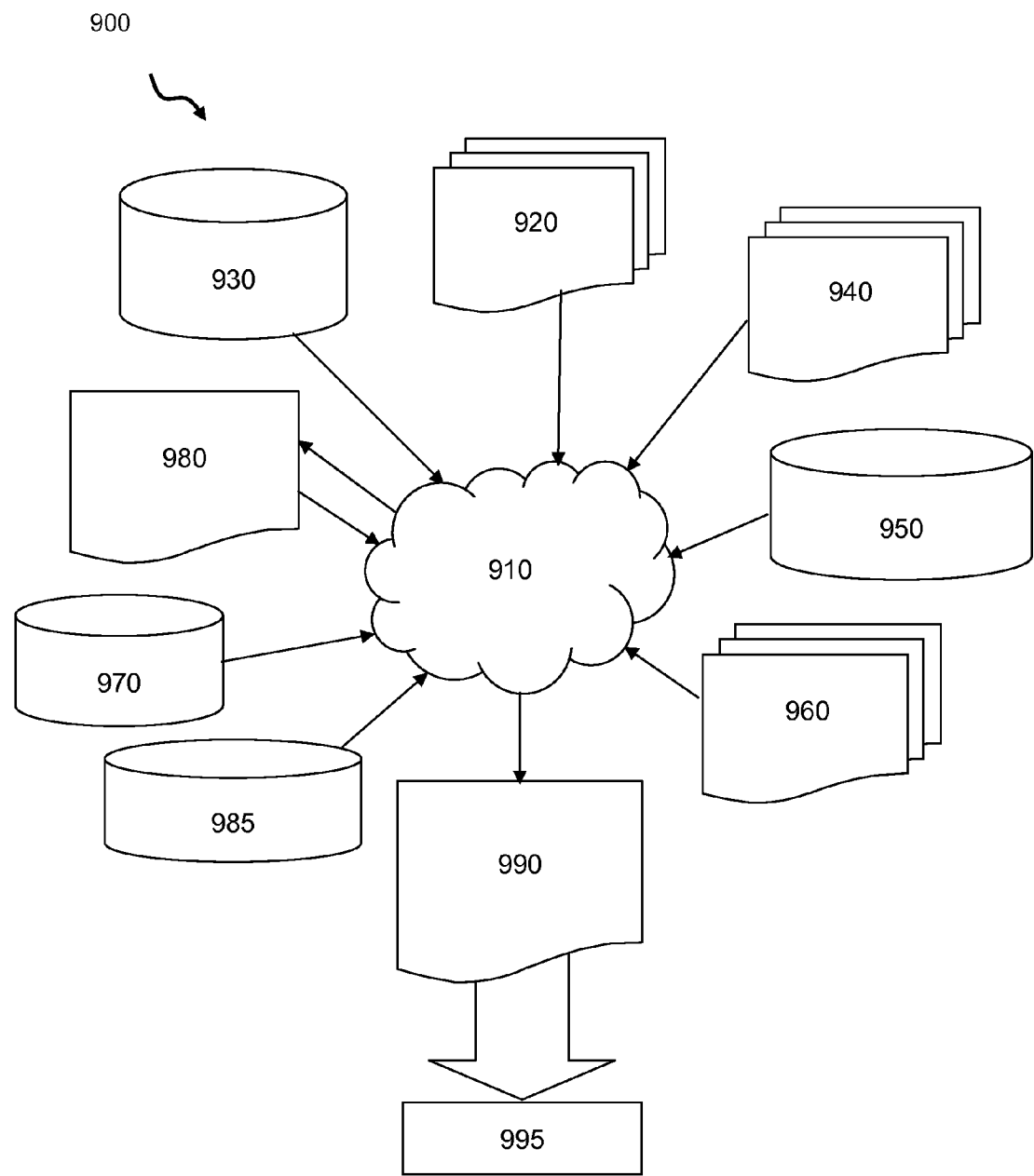
FIG. 14 is a flow diagram of a design process used in semiconductor design, manufacture, and/or test.

FIG. 14 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 12-13b in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIGS. 12-13b. Design process 910 preferably synthesizes (or translates) an embodiment of the invention as shown in FIGS. 12-13b into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 12-13b, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 12-13b. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising:
   a first plate extending from a trench and isolated from a wafer body; and
   a second plate extending from the trench and isolated from the wafer body and the first plate, wherein the first plate and the second plate have exposed regions above the wafer body; and
   a first dielectric layer isolating the first plate from the wafer body, extending from the trench, and formed completely below and directly in contact with the first plate,
   wherein the exposed regions of the first plate and the second plate are directly in contact with contacts at least partially within a trench dielectric boundary.

2. The structure of claim 1, wherein the first plate and the second plate are independent from each other.

3. The structure of claim 1, wherein the first plate and the second plate are formed from one of poly, metal and metal silicide.

4. The structure of claim 1, further comprising a second dielectric layer isolating the first plate from the second plate and extending from the trench.

5. The structure of claim 4, wherein the first plate, the second plate, the first dielectric layer, and the second dielectric layer extend outside the trench and over an uppermost surface of the wafer body.

6. The structure of claim 5, wherein the first plate, the second plate, the first dielectric layer, and the second dielectric layer completely fill the trench.

7. The structure of claim 6, wherein:
the exposed region of the first plate is directly contacting a first contact; and
an exposed region of the second plate is directly contacting a second contact.

8. The structure of claim 4, wherein an exposed region of a top surface of the first plate and an exposed region of a top surface of the second dielectric layer are at a side of a portion of the trench filled with the first dielectric layer, the first plate, the second dielectric layer, and the second plate.

9. The structure of claim 8, further comprising:
a silicon dioxide layer formed on and in physical contact with the wafer body;
a silicon nitride layer formed on and in physical contact with the silicon dioxide layer, the trench formed through the silicon dioxide layer and the silicon nitride layer and into the wafer body;
at least one shoulder comprising an exposed region of a top surface of the silicon nitride layer; and
at least one shallow trench isolation (STI) structure formed through the silicon dioxide layer and the silicon nitride layer and into the wafer body and at a side of the at least one shoulder, and comprising an oxide material.

10. The structure of claim 1, further comprising an isolation structure within the wafer body and on sides of the first plate and the second plate.

11. The structure of claim 1, wherein the first plate and the second plate are of a same material.

12. The structure of claim 1, wherein the first plate and the second plate include a contact region.

13. The structure of claim 1, wherein the trench is scalable to increase or decrease a surface area of the first plate and the second plate thereby increasing or decreasing, respectively, a capacitance target of the structure.

14. The structure of claim 1, wherein the exposed regions above the wafer body form one or more top surfaces of the structure.

15. The structure of claim 1, wherein the first plate and the second plate are formed from one of metal and metal silicide.

16. A method in a computer-aided design system for generating a design structure of a dual contact trench capacitor, the method comprising:
generating, by a processor, a functional representation of a first plate extending from a trench and isolated from a wafer body; and
generating a functional representation of a second plate extending from the trench and isolated from the wafer body and the first plate, wherein the first plate and the second plate have exposed regions above the wafer body; and
generating a functional representation of a first dielectric layer isolating the first plate from the wafer body, extending from the trench, and formed completely below and directly in contact with the first plate,
wherein the exposed regions of the first plate and the second plate are directly in contact with contacts at least partially within a trench dielectric boundary.

17. The method of claim 16, wherein the design structure comprises a netlist.

18. The method of claim 16, wherein the design structure resides on storage medium as a data format used for the exchange of layout data of integrated circuits.

19. The method of claim 16, wherein the exposed regions above the wafer body form one or more top surfaces of the structure.

20. The method of claim 16, wherein the first plate and the second plate are formed from one of metal and metal silicide.

21. The method of claim 16, further comprising generating a functional representation of a second dielectric layer isolating the first plate from the second plate and extending from the trench, wherein the first plate, the second plate, the first dielectric layer, and the second dielectric layer extend outside the trench and over an uppermost surface of the wafer body.

22. The method of claim 21, wherein the first plate, the second plate, the first dielectric layer, and the second dielectric layer completely fill the trench.

23. The method of claim 22, wherein:
the exposed region of the first plate is directly contacting a first contact; and
an exposed region of the second plate is directly contacting a second contact.

24. The method of claim 16, further comprising generating a functional representation of a second dielectric layer isolating the first plate from the second plate and extending from the trench, wherein an exposed region of a top surface of the first plate and an exposed region of a top surface of the second dielectric layer are at a side of a portion of the trench filled with the first dielectric layer, the first plate, the second dielectric layer, and the second plate.

25. The method of claim 24, further comprising:
generating a functional representation of a silicon dioxide layer formed on and in physical contact with the wafer body;
generating a functional representation of a silicon nitride layer formed on and in physical contact with the silicon dioxide layer, the trench formed through the silicon dioxide layer and the silicon nitride layer and into the wafer body;
generating a functional representation of at least one shoulder comprising an exposed region of a top surface of the silicon nitride layer; and
generating a functional representation of at least one shallow trench isolation (STI) structure formed through the silicon dioxide layer and the silicon nitride layer and into the wafer body and at a side of the at least one shoulder, and comprising an oxide material.

* * * * *